(12) United States Patent
Fujii

(10) Patent No.: US 11,462,625 B2
(45) Date of Patent: Oct. 4, 2022

(54) SEMICONDUCTOR DEVICE HAVING FLUORINE IN THE INTERFACE REGIONS BETWEEN THE GATE ELECTRODE AND THE CHANNEL

(71) Applicant: ASAHI KASEI MICRODEVICES CORPORATION, Tokyo (JP)

(72) Inventor: Shuntaro Fujii, Tokyo (JP)

(73) Assignee: Asahi Kasel Microdevices Corporation, Tokyo (JP)

( * ) Notice: Subject to any disclaimer, the term of this patent is extended or adjusted under 35 U.S.C. 154(b) by 0 days.

(21) Appl. No.: 17/172,165

(22) Filed: Feb. 10, 2021

(65) Prior Publication Data

US 2021/0265480 A1 Aug. 26, 2021

(30) Foreign Application Priority Data

Feb. 20, 2020 (JP) .............................. JP2020-027284
Jan. 13, 2021 (JP) .............................. JP2021-003171

(51) Int. Cl.
*H01L 29/51* (2006.01)
*H01L 29/423* (2006.01)
(Continued)

(52) U.S. Cl.
CPC .......... *H01L 29/51* (2013.01); *H01L 21/2253* (2013.01); *H01L 21/26513* (2013.01);
(Continued)

(58) Field of Classification Search
None
See application file for complete search history.

(56) References Cited

U.S. PATENT DOCUMENTS 5,061,975 A * 10/1991 Inuishi ................ H01L 29/7836
257/E21.345
6,191,463 B1 * 2/2001 Mitani .............. H01L 29/78603
257/E29.345

(Continued)

FOREIGN PATENT DOCUMENTS

EP 0908947 A2 4/1999
JP H111111637 A * 4/1999

(Continued)

OTHER PUBLICATIONS

Mitani, et al. "Impact of Deuterium and Fluorine Incorporation on Weibull Distribution of Dielectric Breakdown in Gate Dielectrics" in ECS Transactions, 19(2), pp. 227-242, 2009 (Year: 2009).*

*Primary Examiner* — Erik Kielin
(74) *Attorney, Agent, or Firm* — Morgan, Lewis & Bockius LLP

(57) ABSTRACT

The semiconductor device includes a well region disposed in a surface layer of a semiconductor substrate, a source region and a drain region arranged separated from each other in a surface layer of the well region, a channel region disposed between the source region and the drain region, and a gate electrode disposed on the channel region via a gate insulating film containing fluorine, in which concentration of fluorine existing in a first interface, the first interface being an interface of the gate insulating film with the gate electrode, and concentration of fluorine existing in a second interface, the second interface being an interface of the gate insulating film with the channel region, are higher than concentration of fluorine existing in a middle region in the depth direction of the gate insulating film, and fluorine concentration in the first interface is higher than fluorine concentration in the second interface.

9 Claims, 12 Drawing Sheets

(51) Int. Cl.
  *H01L 29/49*     (2006.01)
  *H01L 29/78*     (2006.01)
  *H01L 29/66*     (2006.01)
  *H01L 21/265*    (2006.01)
  *H01L 21/28*     (2006.01)
  *H01L 21/3115*   (2006.01)
  *H01L 21/225*    (2006.01)

(52) U.S. Cl.
  CPC .. *H01L 21/28035* (2013.01); *H01L 21/28176* (2013.01); *H01L 21/31155* (2013.01); *H01L 29/42364* (2013.01); *H01L 29/42376* (2013.01); *H01L 29/4916* (2013.01); *H01L 29/66492* (2013.01); *H01L 29/7833* (2013.01)

(56) References Cited

U.S. PATENT DOCUMENTS

| | | |
|---|---|---|
| 2005/0136579 A1 | 6/2005 | Hao et al. |
| 2013/0034941 A1 | 2/2013 | Dhar et al. |
| 2014/0361385 A1* | 12/2014 | Zaka ................ H01L 29/51 438/585 |
| 2016/0247884 A1 | 8/2016 | Ohashi et al. |
| 2018/0286950 A1 | 10/2018 | Fujii |

FOREIGN PATENT DOCUMENTS

| | | |
|---|---|---|
| JP | H11-163345 A | 6/1999 |
| JP | 2014-527717 A | 10/2014 |
| JP | 2016-004952 A | 1/2016 |
| JP | 2016-157762 A | 9/2016 |
| JP | 2018-170332 A | 11/2018 |

\* cited by examiner

SEMICONDUCTOR DEVICE HAVING FLUORINE IN THE INTERFACE REGIONS BETWEEN THE GATE ELECTRODE AND THE CHANNEL

CROSS REFERENCE TO RELATED APPLICATIONS AND INCORPORATION BY REFERENCE

This application claims benefit of priority under 35 USC 119 based on Japanese Patent Applications No. 2020-027284 filed on Feb. 20, 2020, and No. 2021-003171 filed on Jan. 13, 2021, the entire contents of which are incorporated by reference herein.

TECHNICAL FIELD

The present disclosure relates to a semiconductor device and a manufacturing method of the semiconductor device.

BACKGROUND ART

For advancing the performance of an analog circuit, it is effective to reduce 1/f noise of a metal oxide semiconductor (MOS) that is a semiconductor device arranged in the circuit. Thus, performing high-temperature lamp annealing treatment after a polysilicon film, which serves as a gate electrode, has been formed has conventionally been proposed (for example, JP 2016-004952 A).

SUMMARY

However, when the lamp annealing treatment is performed at a higher temperature for a longer period of time than those prescribed by conditions for the above-described high-temperature lamp annealing treatment, a heavy load is imposed on the semiconductor manufacturing machines which are used in the lamp annealing treatment. For this reason, by the above-described method, it has been difficult to further reduce 1/f noise of the semiconductor devices while suppressing damage to the semiconductor manufacturing machines.

The present disclosure has been made in consideration of the above-described problem, and an object of the present disclosure is to provide a semiconductor device the reliability of which is further improved by further reducing 1/f noise while suppressing damage to the semiconductor device and a manufacturing method of the semiconductor device.

In order to solve the above-described problem, a semiconductor device according to one aspect of the present disclosure includes a well region disposed in a surface layer portion of a semiconductor substrate, a source region and a drain region arranged separated from each other in a surface layer portion of the well region, a channel region disposed between the source region and the drain region, and a gate electrode disposed on the channel region via a gate insulating film containing fluorine, in which concentration of fluorine existing in a first interface region, the first interface region being an interface of the gate insulating film with the gate electrode, and concentration of fluorine existing in a second interface region, the second interface region being an interface of the gate insulating film with the channel region, are higher than concentration of fluorine existing in a middle region in a depth direction of the gate insulating film and fluorine concentration in the first interface region is higher than fluorine concentration in the second interface region.

In addition, a manufacturing method of a semiconductor device according to another aspect of the present disclosure includes implanting well impurity ions into a surface layer portion of a semiconductor substrate, implanting channel impurity ions into a surface layer portion of the semiconductor substrate, forming a well region and a channel region by performing first heat treatment on the semiconductor substrate after the well impurity ions and the channel impurity ions have been implanted, forming a gate insulating film on a surface layer portion of the semiconductor substrate on which the first heat treatment is performed, forming a polysilicon film on the gate insulating film, performing second heat treatment on the semiconductor substrate on which the polysilicon film is formed, and forming a gate electrode by, after the second heat treatment, implanting fluorine ions and gate impurity ions into the polysilicon film and patterning the polysilicon film.

One aspect of the present disclosure enables a semiconductor device the reliability of which is further improved by further reducing 1/f noise while suppressing damage to the semiconductor device and a manufacturing method of the semiconductor device to be provided.

DETAILED DESCRIPTION

Hereinafter, the present disclosure will be described through embodiments, but it should be understood that the following embodiment does not limit the scope of the invention set forth in the claims to the embodiments. In addition, all combinations of features described in the embodiments are not always indispensable for the solution proposed by the invention.

An embodiment of the present disclosure will now be described with reference to the drawings. Note that, in all the drawings for a description of embodiments of the invention, the same signs are assigned to constituent components having the same functions and a duplicate description thereof will be omitted. In addition, to make the drawings easily viewable, illustration of an interlayer insulating film and wirings on a silicon substrate is omitted in FIG. 1.

In the following embodiment, an example in which the present disclosure is applied to a semiconductor device that includes a metal oxide semiconductor field effect transistor (MOSFET) the gate insulating film of which is made of a silicon oxide as an insulated gate type field effect transistor will be described.

1. Schematic Configuration of Semiconductor Device

First, a schematic configuration of a semiconductor device 1 according to an embodiment of the present disclosure will be described using FIG. 1.

Figure 1:
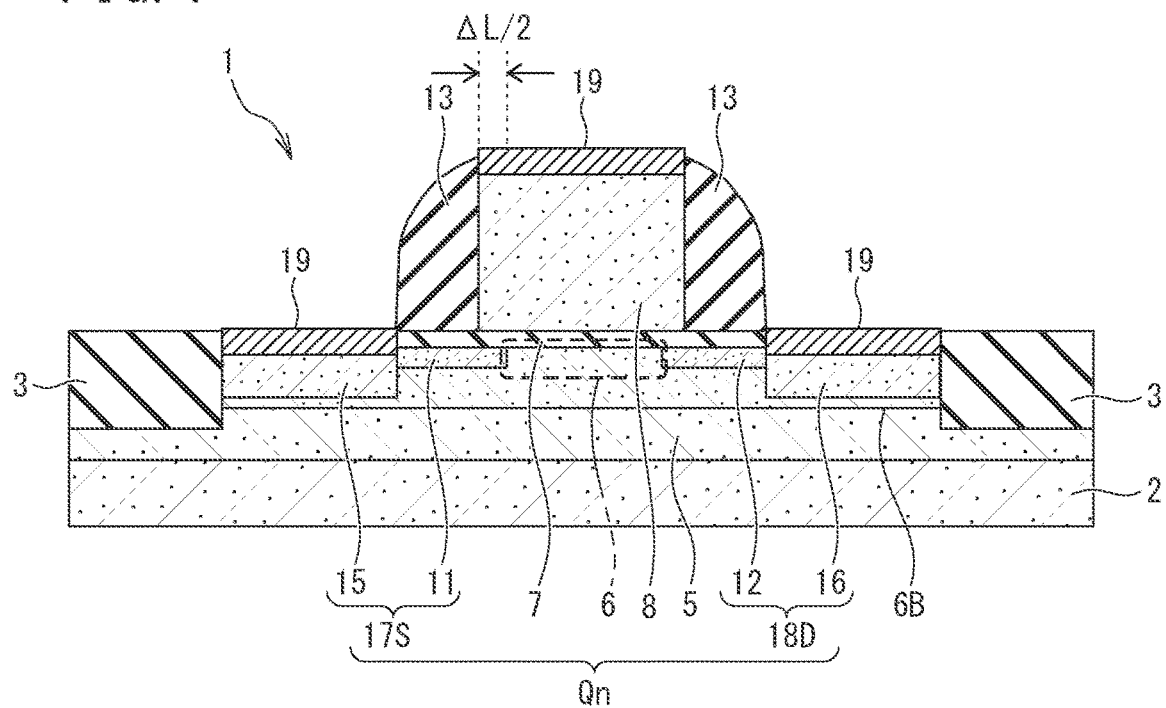
FIG. 1 is a cross-sectional view of a main part illustrative of a schematic configuration of a semiconductor device according to an embodiment of the present disclosure.

As illustrated in FIG. 1, the semiconductor device 1 according to the embodiment of the present disclosure includes, for example, a single-crystal silicon substrate 2 as a semiconductor substrate. The silicon substrate 2 is, for example, a first conductivity type (n-type) substrate or a second conductivity type (p-type) substrate having a deep N-well. In addition, the semiconductor device 1 includes, for example, an n-channel conductivity type MOSFET-Qn as an insulated gate type field effect transistor that constitutes an analog circuit. The MOSFET-Qn is formed in an element formation region in a surface layer portion of the silicon substrate 2. The element formation region of the silicon substrate 2 is partitioned by an element separation layer 3 formed in an element separation region in the surface layer portion of the silicon substrate 2 and is insulatingly separated from other element formation regions. The element separation layer 3 is formed by, for example, a well-known shallow trench isolation (STI) technology, although not limited thereto.

The element separation layer 3 formed by the STI technology is formed into a configuration in which an insulating film for element separation that is formed of, for example, silicon oxide is buried in a shallow trench (for example, a trench with a depth of approximately 400 nm) that is formed in the element isolation region in the surface layer portion of the silicon substrate 2. The element separation layer 3 is formed by forming an insulating film for element separation, which is formed of, for example, silicon oxide, all over the surface of the surface layer portion of the silicon substrate 2, where a shallow trench is formed in the element separation region, and removing a portion of the insulating film for element separation in such a way that the insulating film for element separation is selectively left inside the shallow trench. The insulating film for element separation is formed by, for example, a chemical vapor deposition (CVD)

method. In addition, the insulating film for element separation is planarized by a chemical mechanical polishing (CMP) method and a portion thereof is thereby removed.

The element separation layer 3 may also be formed by a local oxidation of silicon (LOCOS) method.

In the element formation region in the surface layer portion of the silicon substrate 2, for example, a second conductivity type (p-type) well region 5 is formed, and, in a surface layer portion of the well region 5, the MOSFET-Qn is formed.

The MOSFET-Qn includes a source region 17S and a drain region 18D that are arranged separated from each other and a channel region 6 that is disposed between the source region 17S and the drain region 18D in the surface layer portion of the well region 5 and a gate electrode 8 that is disposed on the channel region 6 via a gate insulating film 7.

The source region 17S includes an n-type extension region 11 and an n-type contact region (deep source region) 15. The drain region 18D includes an n-type extension region 12 and an n-type contact region (deep drain region) 16. The extension regions 11 and 12 are formed in alignment with the gate electrode 8. In other words, the extension region 11 formed in the source region 17S is disposed in such a way that a junction position ($\Delta L/2$) between the extension region 11 and the channel region 6 is located on the inner side of an edge of the gate electrode 8. Similarly, the extension region 12 formed in the drain region 18D is disposed in such a way that a junction position between the extension region 12 and the channel region 6 is located on the inner side of the opposite edge of the gate electrode 8.

More specifically, the above-described junction positions of the extension regions 11 and 12 are preferably located 30 nm or more inward from the edges of the gate electrode 8. Because of this requirement, the extension regions 11 and 12 are formed in such a way as to come into contact with a region in which fluorine concentration is comparatively low within the gate insulating film 7, and the channel region 6 is formed in such a way as to come into contact with a middle region of the gate insulating film 7 in which the fluorine concentration is comparatively high. Therefore, it is possible to prevent the channel region 6 from coming into contact with a region in which effect of reduction in interface state density is small.

In order to form the extension regions 11 and 12 in such a way that the junction positions are located 30 nm or more inward from the edges of the gate electrode 8, it is preferable to use phosphorus ions ($P^+$), which are likely to diffuse in subsequent annealing treatment, rather than arsenic ions ($As^+$) as extension impurity ions. In addition, the extension regions 11 and 12 may be formed by implanting extension impurities in a tilted direction toward below the gate electrode 8. It is preferable to set a tilt angle at the time of extension impurity implantation within a range of 60 degrees or less.

The contact regions 15 and 16 are formed in alignment with sidewall spacers 13 that are disposed on the side surfaces of the gate electrode 8. The extension regions 11 and 12 are formed in shallower regions than the contact regions 15 and 16, respectively, in order to reduce short-channel effect. The contact regions 15 and 16 are formed with a higher impurity concentration than the extension regions 11 and 12 for the purpose of reducing contact resistance with wirings connected to the source region and the drain region, respectively.

The channel region 6 is a region disposed between the source region and the drain region within a channel impurity layer 6B that is disposed in the surface layer portion of the well region 5. The channel impurity layer 6B is formed by channel impurity ions that are implanted into the surface layer portion of the silicon substrate 2 in order to control threshold voltage Vth of the MOSFET-Qn. As the channel impurity ions, boron ions ($B^+$), boron difluoride ions ($BF_2^+$), indium ions ($In^+$), or the like, which exhibit the p-type conductivity, are used. In other words, the channel region 6 contains boron or indium. In the channel region 6, a channel (current path) that is controlled by voltage applied to the gate electrode 8 and electrically connects the source region 17S and the drain region 18D to each other is formed.

The gate insulating film 7 is formed of, for example, a silicon oxide ($SiO_2$) film by a thermal oxidation method. As the gate insulating film 7, a silicon oxynitride film (SiON) or a silicon nitride film ($Si_3N_4$) or a high permittivity insulating film formed by an atomic layer deposition method (ALD) may also be used.

The gate insulating film 7 contains fluorine inside thereof. Because of this configuration, in the gate insulating film 7, fluorine terminates interface states, which causes the interface state density at the interface with the silicon substrate 2 to be reduced.

Further, in the gate insulating film 7, fluorine segregates in the depth direction (in the thickness direction of the gate insulating film 7). The concentration of fluorine existing in a first interface region that is an interface of the gate insulating film 7 with the gate electrode 8 is higher than the concentration of fluorine existing in a middle region in the depth direction of the gate insulating film 7. Similarly, the concentration of fluorine existing in a second interface region that is an interface of the gate insulating film 7 with the channel region 6 is higher than the concentration of fluorine existing in the middle region in the depth direction of the gate insulating film 7.

A peak value of the fluorine concentration in the second interface region is preferably $1 \times 10^{20}$ $cm^{-3}$ or more and $1 \times 10^{21}$ $cm^{-3}$ or less. The fluorine concentration in the first interface region is preferably higher than the fluorine concentration in the second interface region.

On the other hand, in the gate insulating film 7, the fluorine concentration is not uniform in the gate length direction (a direction perpendicularly intersecting the depth direction) due to outward diffusion of fluorine. The concentration of fluorine in the gate insulating film 7 decreases from a position 150 nm inward in the gate length direction from an edge of the gate electrode 8 toward the edge of the gate electrode 8. In other words, in the gate insulating film 7, the concentration of fluorine becomes lower as it comes closer to an edge in the gate length direction. In the gate insulating film 7, the concentration of fluorine at the position of an edge of the gate electrode 8 is one third or less of the concentration of fluorine at the middle position in the gate length direction of the gate electrode 8.

In the gate insulating film 7 on the inside of which fluorine segregates as described above, the interface state density (Nss) in the second interface region (the interface of the gate insulating film 7 with the channel region 6) is preferably $1 \times 10^{10}$ $cm^{-2}$ or less. Reduction in the interface state density (Nss) in the second interface region causes 1/f noise in the semiconductor device 1 to be reduced.

The thickness of the gate insulating film 7 is preferably 2 nm or more. Focusing on a ratio of a peak value of the fluorine concentration in the second interface region to a minimum value of the fluorine concentration in the gate insulating film 7 (hereinafter, referred to as a fluorine segregation ratio), setting the thickness of the gate insulating film 7 at a value within the above-described range enables the fluorine segregation ratio to be set at 30 or more. A purpose of the introduction of fluorine is to terminate interface states in the second interface region, using fluorine. As such, the fluorine segregation ratio is preferably set at a large value, and setting the fluorine segregation ratio at 30 or more enables the 1/f noise to be reduced more greatly.

The gate electrode 8 is made of, for example, a polysilicon film, and, for example, phosphorus ions ($P^+$) or arsenic ions ($As^+$) are implanted into the polysilicon film as gate impurity ions that reduce a resistance value after film formation.

There are some cases where P-type polysilicon into which boron ions ($B^+$) are implanted is used for a PMOS transistor. However, when a semiconductor device has a gate insulating film 7 into which fluorine is introduced as does the semiconductor device 1 according to the present disclosure, the fluorine facilitates boron ions ($B^+$) to diffuse. In particular, when the thickness of the gate insulating film is thin (for example, 5 nm or less), boron ions ($B^+$) penetrate the gate insulating film from the gate electrode and reach the silicon substrate, which causes the characteristics of the PMOS transistor to deviate from design values. Thus, it is preferable not to introduce fluorine into a PMOS transistor at the time of forming a semiconductor device 1 of the present disclosure.

The gate length (physical gate length Lg) of the gate electrode 8 is preferably 300 nm or more. As described above, the concentration of fluorine in the gate insulating film 7 decreases from a position 150 nm inward in the gate length direction from an edge of the gate electrode 8 toward the edge of the gate electrode 8. Thus, setting the gate length of the gate electrode 8 at 300 nm or more enables influence of decrease in the fluorine concentration to be small at the middle position in the gate length direction of the gate electrode 8.

On the respective upper surfaces of the gate electrode 8 and the contact regions 15 and 16, silicide layers (metal-semiconductor reaction layers) 19 are disposed. The silicide layers 19 are formed in alignment with the sidewall spacers 13 by, for example, a salicide technology. As the silicide layers 19, cobalt silicide ($CoSi_2$), titanium silicide ($TiSi_2$), nickel silicide ($NiSi_2$), or the like can be used.

2. Manufacturing Method of Semiconductor Device

Next, a manufacturing method of the semiconductor device 1 according to the embodiment of the present disclosure will be described using FIGS. 2 to 15.

First, the silicon substrate 2 is prepared as a semiconductor substrate.

Figure 2:
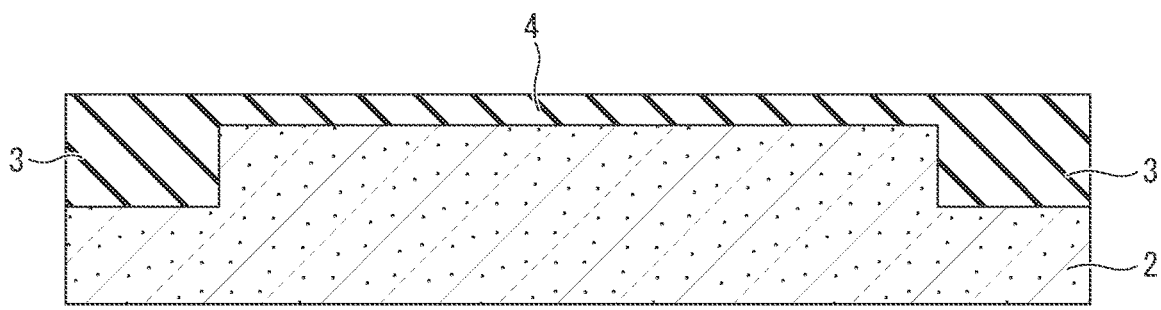
FIG. 2 is a cross-sectional view of a main part for a description of a manufacturing method of the semiconductor device according to the embodiment of the present disclosure.

As illustrated in FIG. 2, the element separation layer 3, which partitions an element formation region in a surface layer portion of the silicon substrate 2, is formed. The element separation layer 3 is formed by, for example, a well-known STI technology. Next, as illustrated in FIG. 2, a through film 4, which is a silicon oxide film, is formed on the element formation region in the surface layer portion of the silicon substrate 2 by, for example, a thermal oxidation method.

Figure 3:
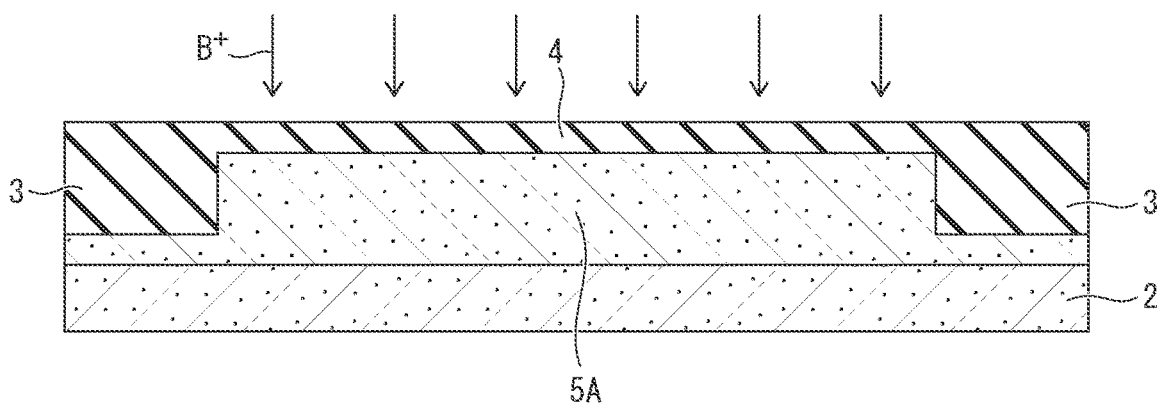
FIG. 3 is another cross-sectional view of the main part for a description of the manufacturing method of the semiconductor device according to the embodiment of the present disclosure.

As illustrated in FIG. 3, for example, boron ions ($B^+$), which exhibit the p-type conductivity, are selectively implanted into the element formation region in the surface layer portion of the silicon substrate 2 through the through film 4 as well impurity ions. The implantation of boron ions ($B^+$) is performed under the condition of, for example, a dose amount of approximately $1\times10^{12}$ cm$^{-2}$ or more and $2\times10^{13}$ cm$^{-2}$ or less and an acceleration energy of approximately 50 keV or more and 250 keV or less. The implantation of boron ions ($B^+$) causes a well impurity ion-implanted region 5A with boron ions implanted to be formed in the surface layer portion of the silicon substrate 2, as illustrated in FIG. 3.

Figure 4:
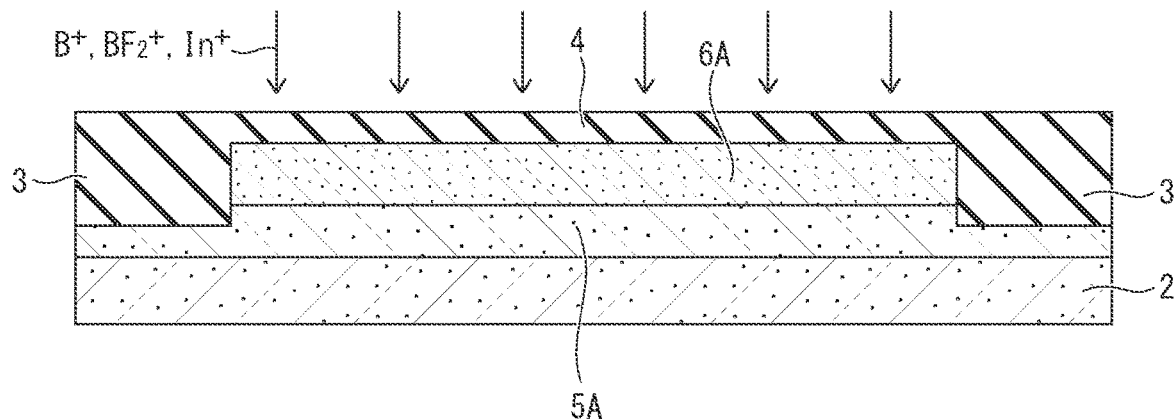
FIG. 4 is still another cross-sectional view of the main part for a description of the manufacturing method of the semiconductor device according to the embodiment of the present disclosure.

As illustrated in FIG. 4, one of boron ions ($B^+$), boron difluoride ions ($BF_2^+$), and indium ions ($In^+$), which exhibit the p-type conductivity, are selectively implanted into the element formation region in the surface layer portion of the silicon substrate 2 through the through film 4 as channel impurity ions for control of threshold voltage of the MOSFET-Qn. The implantation of boron ions ($B^+$) is performed under the condition of an acceleration energy of approximately 10 keV or more and 60 keV or less. The implantation of boron difluoride ions ($BF_2^+$) is performed under the condition of an acceleration energy of approximately 30 keV or more and 80 keV or less. The implantation of indium ions ($In^+$) is performed under the condition of an acceleration energy of approximately 80 keV or more and 120 keV or less. The implantation of any of the ions is performed under the condition of a dose amount of $3\times10^{11}$ cm$^{-2}$ or more and $5\times10^{13}$ cm$^{-2}$ or less. The implantation of channel impurity ions causes a channel impurity ion-implanted region 6A to be formed in the surface layer portion of the silicon substrate 2, as illustrated in FIG. 4. The channel impurity ion-implanted region 6A is formed shallower than the well impurity ion-implanted region 5A.

Figure 5:
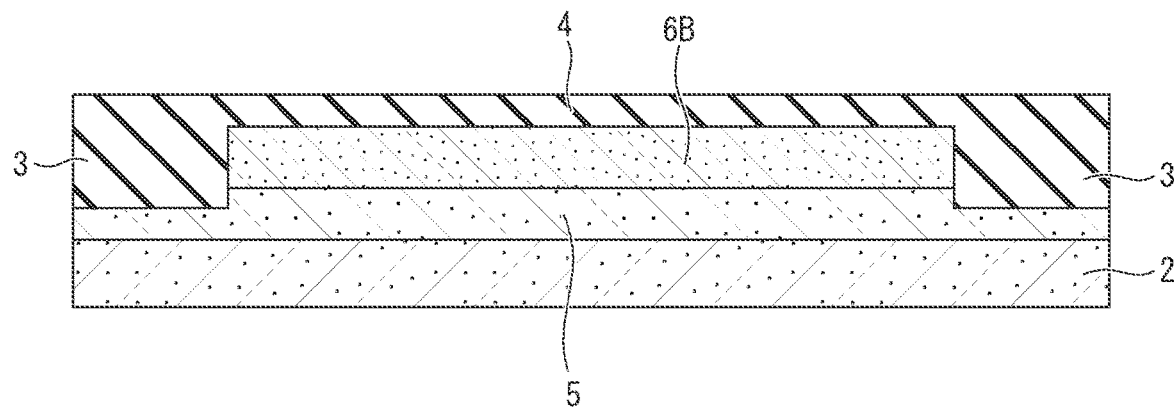
FIG. 5 is still another cross-sectional view of the main part for a description of the manufacturing method of the semiconductor device according to the embodiment of the present disclosure.

Next, activation annealing as first heat treatment is performed on the silicon substrate 2 after well impurity ions and channel impurity ions have been implanted thereinto. The activation annealing causes the well impurity ions and the channel impurity ions to be activated. The activation annealing causes the p-type well region 5 to be formed in the well impurity ion-implanted region 5A, as illustrated in FIG. 5. The activation annealing also causes a p-type channel impurity layer 6B, which is to be used as a channel region, to be formed in the channel impurity ion-implanted region 6A. The channel impurity layer 6B is formed shallower than the well region 5.

Figure 6:
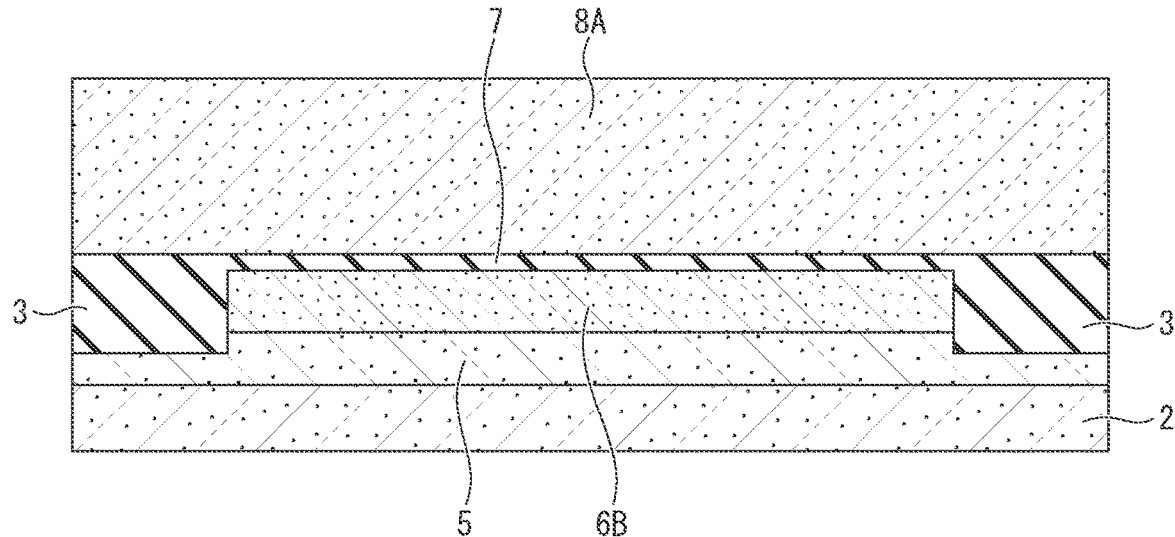
FIG. 6 is still another cross-sectional view of the main part for a description of the manufacturing method of the semiconductor device according to the embodiment of the present disclosure.

Next, after the through film 4 has been removed, the gate insulating film 7, which is a silicon dioxide film, is formed in the element formation region in the surface layer portion of the silicon substrate 2, as illustrated in FIG. 6. The gate insulating film 7 is preferably formed by a thermal oxidation method or plasma oxidation. The thickness of the gate insulating film 7 is preferably 2 nm or more. Setting the thickness of the gate insulating film 7 within the above-described range enables the fluorine segregation ratio to be set at 30 or more and the 1/f noise to be reduced more greatly.

Succeedingly, as illustrated in FIG. 6, a non-doped polysilicon film 8A, which is to serve as the gate electrode 8 later, is formed all over the surface of the surface layer portion of the silicon substrate 2 including the upper surface of the gate insulating film 7 by a CVD method.

When polysilicon is used as a gate electrode material in this processing, it is indispensable to form the polysilicon film 8A as a non-doped polysilicon film in which respective concentrations of a donor element and an acceptor element are a detection limit or lower (for example, the respective impurity concentrations are $1\times10^{16}$ cm$^{-3}$ or less or ideally zero). The reason for the requirement is that, when an acceptor element or the like is contained in the polysilicon film 8A serving as a gate electrode material, there is a possibility that performing high-temperature heat treatment on the polysilicon film 8A causes the acceptor element or the like to infiltrate into the gate insulating film 7 and the silicon substrate 2 from the polysilicon film 8A and adverse effects, such as causing the threshold voltage Vth of the MOSFET- Qn to fluctuate, to be exerted. In other words, the "non-doped polysilicon film" in the embodiment means a silicon film where silicon is not deposited in conjunction with gate impurities to be doped at the time of deposition of a film or gate impurities are not implanted into a non-doped silicon film.

Figure 7:
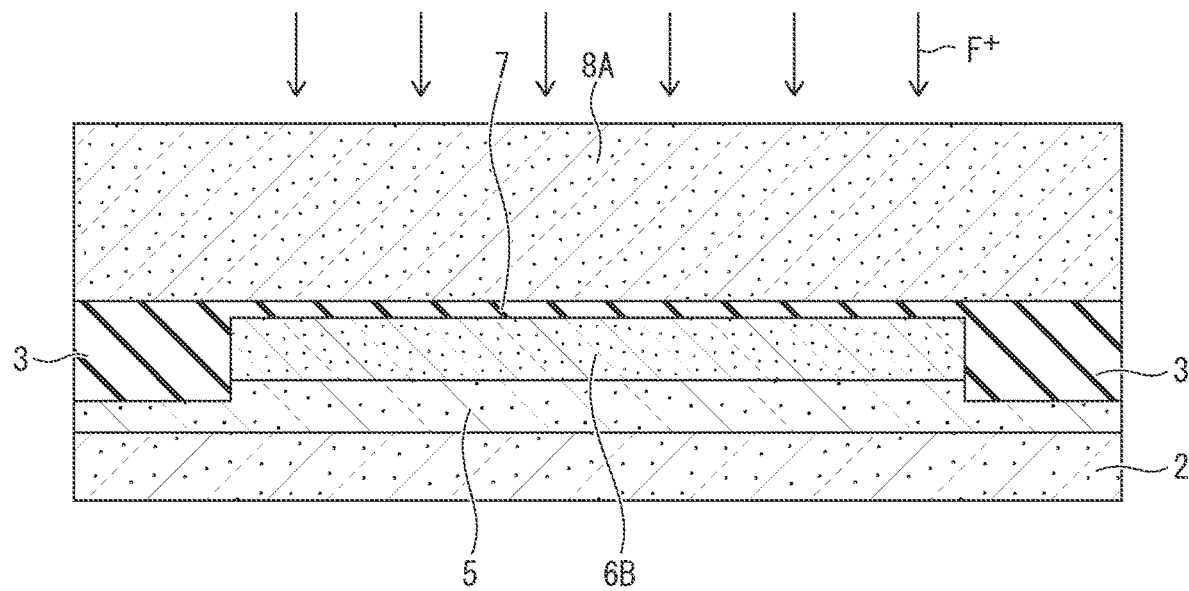
FIG. 7 is still another cross-sectional view of the main part for a description of the manufacturing method of the semiconductor device according to the embodiment of the present disclosure.

Next, high-temperature lamp annealing as second heat treatment is performed on the silicon substrate 2 on which the polysilicon film 8A is formed. The high-temperature lamp annealing is performed by, for example, a rapid thermal anneal (RTA) method. In other words, the high-temperature lamp annealing is performed while the polysilicon film is in a non-doped state in which gate impurities have not been implanted into the non-doped polysilicon film. It is preferable to perform this additional annealing in, for example, a mixed gas atmosphere containing nitrogen ($N_2$) and oxygen ($O_2$). It is preferable to perform the high-temperature lamp annealing under the condition that annealing temperature is in a range of 965° C. or more and 1125° C. or less and annealing time is in a range of 15 seconds or more and 60 seconds or less Next, after the high-temperature lamp annealing has been performed on the silicon substrate 2, fluorine ions ($F^+$) are implanted into the polysilicon film 8A in a region in which the MOSFET-Qn is to be formed, as illustrated in FIG. 7. On this occasion, it is preferable to set implantation depth of fluorine ions shallower than the thickness of the polysilicon film 8A in order to suppress damage to the gate insulating film 7 caused by the ion implantation. For example, when the thickness of the polysilicon film 8A is 250 nm, the acceleration energy of fluorine is preferably in a range of 10 keV or more and 30 keV or less. In addition, it is preferable to set a dose amount of fluorine in such a way that, in particular, the fluorine concentration in the vicinity of the interface of the gate insulating film 7 with the silicon substrate 2 (the channel region 6) within the gate insulating film 7 is in a range of $1 \times 10^{20}$ cm$^{-3}$ or more and $1 \times 10^{21}$ cm$^{-3}$ or less. For example, when the thickness of the gate insulating film 7 is 12 nm, the dose amount of fluorine is preferably in a range of $4 \times 10^{15}$ cm$^{-2}$ or more and $8 \times 10^{15}$ cm$^{-2}$ or less.

The implantation of fluorine ions is performed after the above-described high-temperature lamp annealing has been performed. Therefore, it is possible to set the fluorine segregation ratio at 30 or more.

Figure 8:
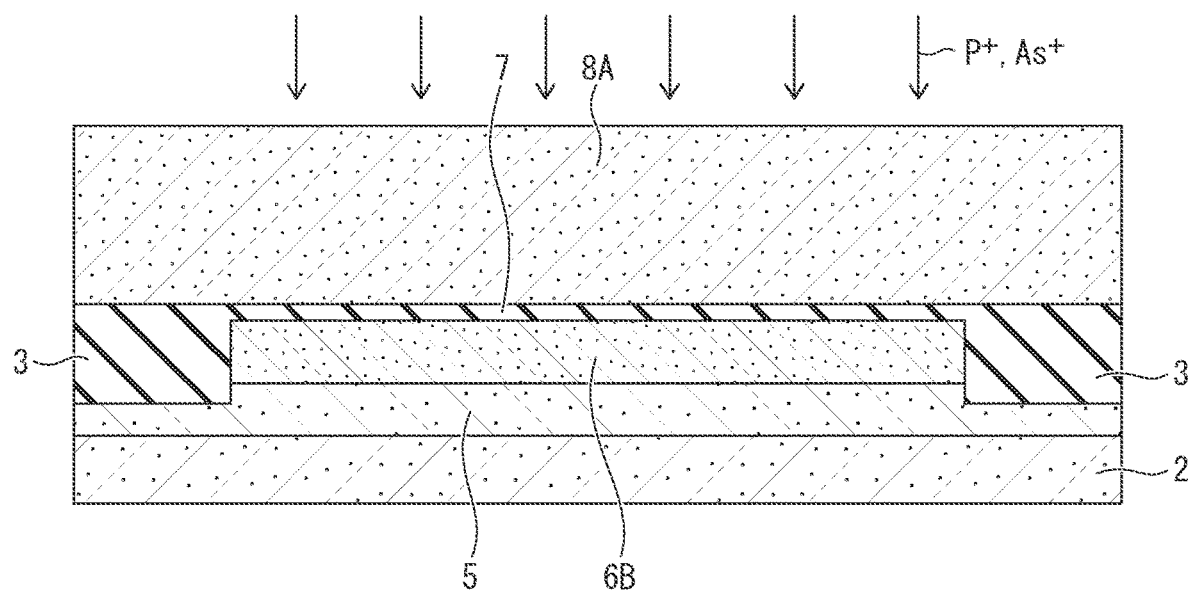
FIG. 8 is still another cross-sectional view of the main part for a description of the manufacturing method of the semiconductor device according to the embodiment of the present disclosure.

As illustrated in FIG. 8, gate impurity ions are implanted into the polysilicon film 8A in the region in which the MOSFET-Qn is to be formed. As the gate impurity ions, donor element ions, such as phosphorus ions ($P^+$) and arsenic ions ($As^+$), which exhibit the n-type conductivity, are used. Since the implantation of gate impurity ions is performed after the above-described additional annealing has been performed, it becomes possible to suppress depletion of the gate electrode, which exerts adverse effects on the 1/f noise in the MOSFET-Qn, without causing penetration of gate impurity ions from the polysilicon film 8A as a gate electrode material into the silicon substrate 2.

Note that the implantation of fluorine ions ($F^+$) into the polysilicon film 8A illustrated in FIG. 7 and the implantation of gate impurity ions into the polysilicon film 8A illustrated in FIG. 8 may be performed at the same time or performed in the reverse order.

Figure 9:
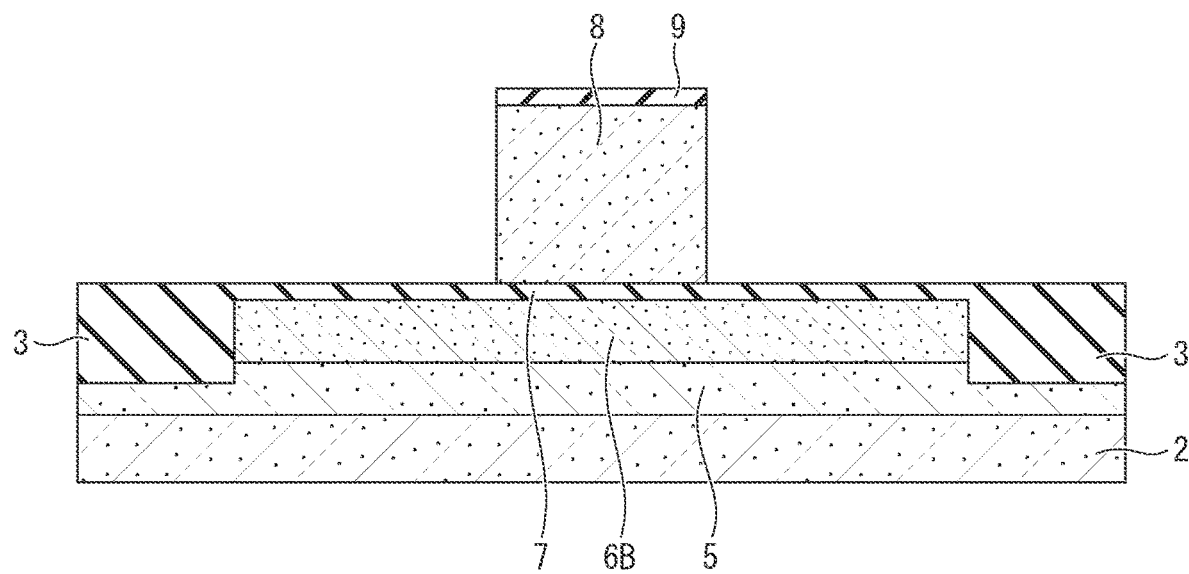
FIG. 9 is still another cross-sectional view of the main part for a description of the manufacturing method of the semiconductor device according to the embodiment of the present disclosure.

As illustrated in FIG. 9, a silicon oxide ($SiO_2$) film, which serves as a hard mask, is formed on the surface of the polysilicon film 8A, into which fluorine ions and gate impurity ions have been implanted, and, subsequently, the polysilicon film 8A is patterned with a predetermined gate length (physical gate length Lg). The silicon oxide film is formed by, for example, a CVD method. In addition, the silicon oxide film is preferably formed with the thickness thereof in a range of 40 nm or more and 60 nm or less, for example, at approximately 50 nm. The gate length is preferably 300 nm or more.

Succeedingly, in order to prevent reliability deterioration due to electric field concentration on an edge portion of the gate electrode 8, which is formed by etching, for example, a reoxidation process is performed in a mixed gas atmosphere containing nitrogen and oxygen as third heat treatment. The reoxidation process is performed under a process condition that does not cause gate impurity ions in the polysilicon film 8A to penetrate into the gate insulating film 7 and that allows fluorine ions to diffuse into the gate insulating film 7. For example, the reoxidation process is preferably performed under the condition of a treatment temperature of 850° C. or less and, specifically, is preferably performed under the condition of a treatment temperature of 850° C. and an annealing time of 40 minutes.

Figure 10:
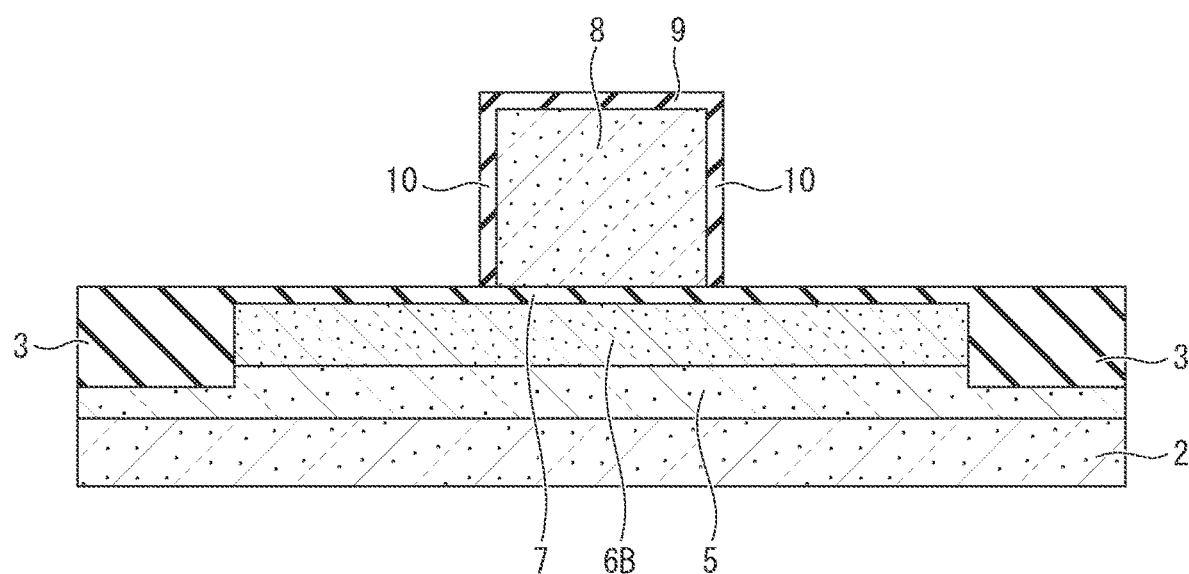
FIG. 10 is still another cross-sectional view of the main part for a description of the manufacturing method of the semiconductor device according to the embodiment of the present disclosure.

The reoxidation process causes the gate insulating film 7 into which fluorine ions are diffused and the gate electrode 8 that is the polysilicon film 8A into which gate impurity ions are implanted to be formed, as illustrated in FIG. 10. The gate insulating film 7 formed in this way has a non-uniform fluorine concentration distribution in both the depth direction and the gate length direction.

In addition, the reoxidation process causes the side surfaces of the gate electrode 8 to be oxidized and oxide films 10 to be thereby formed.

Figure 11:
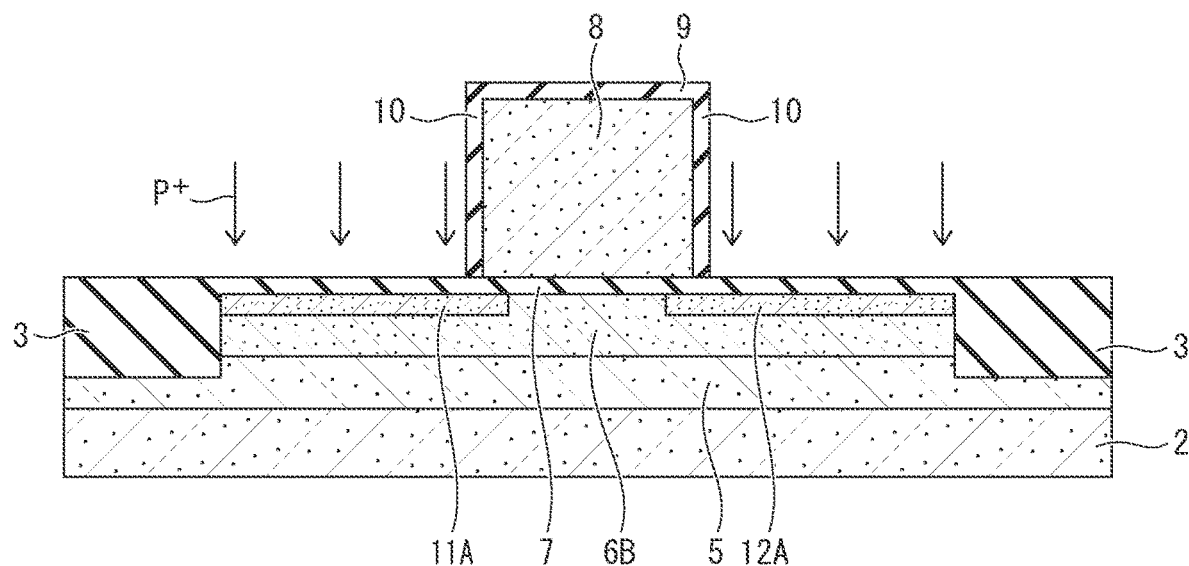
FIG. 11 is still another cross-sectional view of the main part for a description of the manufacturing method of the semiconductor device according to the embodiment of the present disclosure.

As illustrated in FIG. 11, extension impurity ions are selectively implanted into the element formation region in the surface layer portion of the silicon substrate 2, using the gate electrode 8 as a mask. As the extension impurity ions, for example, phosphorus ions ($P^+$) or arsenic ions ($As^+$), which exhibit the n-type conductivity, are used, and phosphorus ions are preferably used. The implantation of phosphorus ions is performed under the condition of, for example, a dose amount of approximately $1 \times 10^{13}$ cm$^{-2}$ or more and $2 \times 10^{15}$ cm$^{-2}$ or less and an acceleration energy of approximately 3 keV to 90 keV. The implantation of extension impurity ions causes extension impurity ion-implanted regions 11A and 12A with phosphorus ions or arsenic ions implanted to be formed in the surface layer portion of the silicon substrate 2, as illustrated in FIG. 11. On this occasion, in order to locate the junction position of the extension region 12 on the inner side of an edge of the gate electrode 8, a tilt angle at the time of implantation of extension impurities is adjusted.

Figure 12:
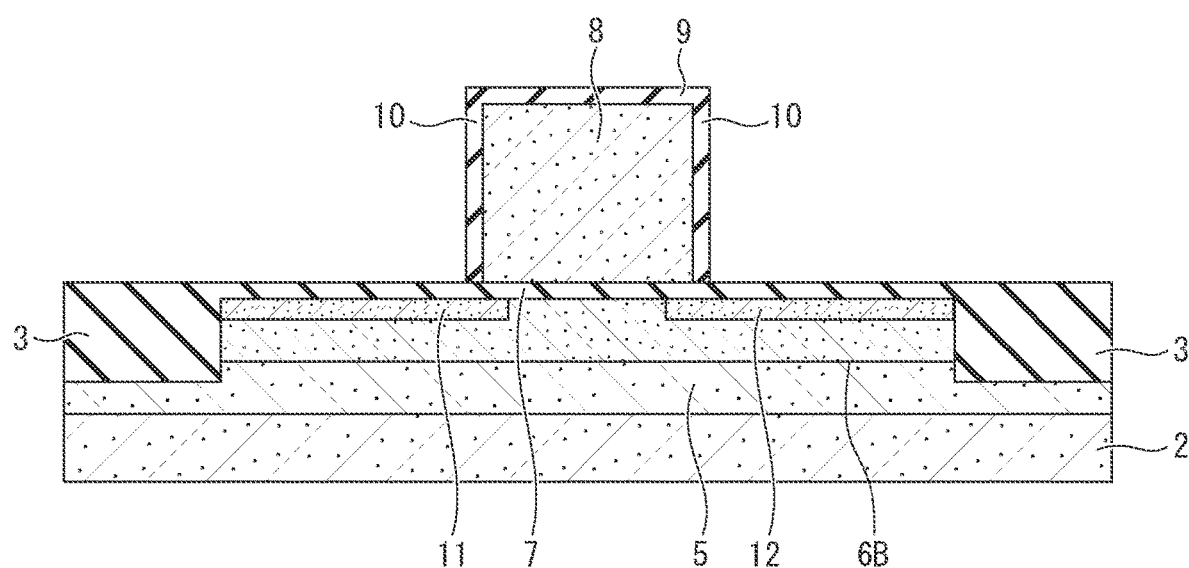
FIG. 12 is still another cross-sectional view of the main part for a description of the manufacturing method of the semiconductor device according to the embodiment of the present disclosure.

As illustrated in FIG. 11, activation annealing as fourth heat treatment for activating extension impurity ions is performed on the silicon substrate 2 after extension impurity ions (for example, phosphorus ions) have been implanted thereinto. In the fourth heat treatment, n-type extension regions 11 and 12 are formed in the extension impurity ion-implanted regions 11A and 12A, into which extension impurity ions are implanted, respectively, as illustrated in FIG. 12. The extension regions 11 and 12 are formed in alignment with the gate electrode 8 in a surface layer portion of the channel impurity layer 6B.

In this processing, phosphorus or arsenic that is extension impurity ions slightly diffuses in the depth direction and the lateral direction (the gate length direction) in the activation annealing. For this reason, distance between the extension region 11 and the extension region 12 becomes shorter than the electrode length of the gate electrode 8. The distance between the extension regions 11 and 12 serves as effective gate length of the MOSFET-Qn and becomes shorter than the physical gate length Lg of the MOSFET-Qn. For example, when the extension regions 11 and 12 are formed in such a way that the junction positions are located 30 nm inward from edges of the gate electrode 8, the effective gate length of the MOSFET-Qn becomes 60 nm shorter than the physical gate length Lg of the MOSFET-Qn.

Figure 13:
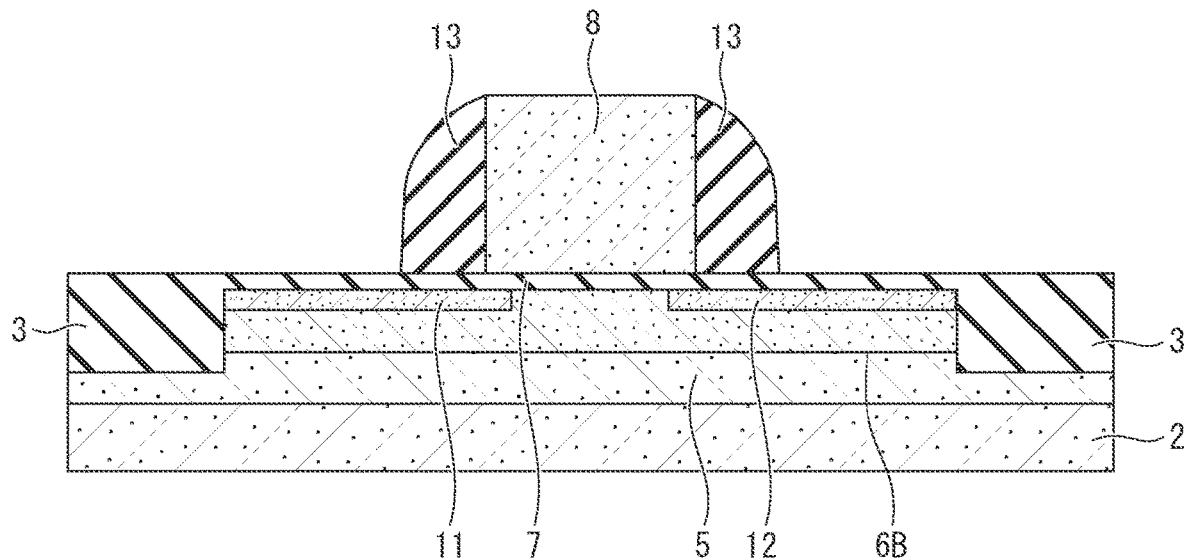
FIG. 13 is still another cross-sectional view of the main part for a description of the manufacturing method of the semiconductor device according to the embodiment of the present disclosure.

As illustrated in FIG. 13, the sidewall spacers 13 are formed on the side surfaces of the gate electrode 8. The sidewall spacers 13 are formed by forming an insulating film all over the surface of the surface layer portion of the silicon substrate 2 including the upper surface of the gate electrode 8 by a CVD method and subsequently performing anisotropic etching, such as reactive ion etching (RIE), on the insulating film. The insulating film is formed of, for example, silicon oxide or silicon nitride. The sidewall spacers 13 are formed in alignment with the gate electrode 8.

Figure 14:
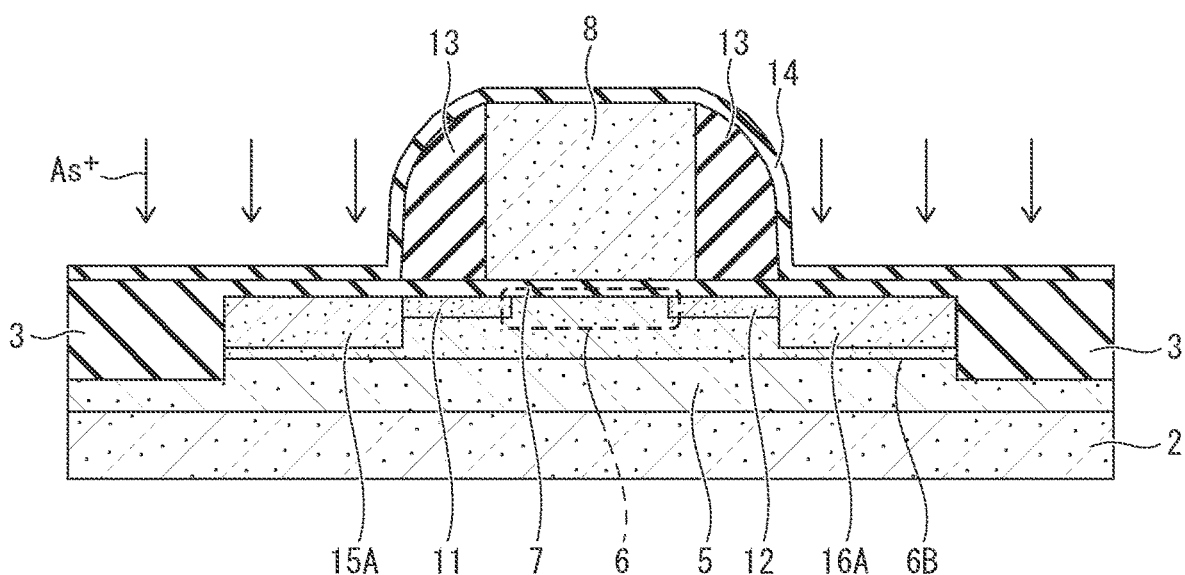
FIG. 14 is still another cross-sectional view of the main part for a description of the manufacturing method of the semiconductor device according to the embodiment of the present disclosure.

As illustrated in FIG. 14, silicon oxide ($SiO_2$), which serves as the through film 14, is formed all over the surface of the surface layer portion of the silicon substrate 2 including the upper surfaces of the gate electrode 8 and the sidewall spacers 13 by a CVD method. On this occasion, the through film 14 is formed with a thickness of, for example, 10 nm. Contact impurity ions are selectively implanted into the element formation region in the surface layer portion of the silicon substrate 2, using the gate electrode 8 and the sidewall spacers 13 as a mask. As the contact impurity ions, for example, arsenic ions ($As^+$), which exhibit the n-type conductivity, are used. The implantation of arsenic ions is performed under the condition of, for example, a dose amount of approximately $1\times10^{15}$ $cm^{-2}$ to $1\times10^{16}$ $cm^{-2}$ and an acceleration energy of approximately 40 keV to 100 keV. The implantation of contact impurity ions causes contact impurity ion-implanted regions 15A and 16A with arsenic ions implanted to be formed in the surface layer portion of the silicon substrate 2, as illustrated in FIG. 14.

Figure 15:
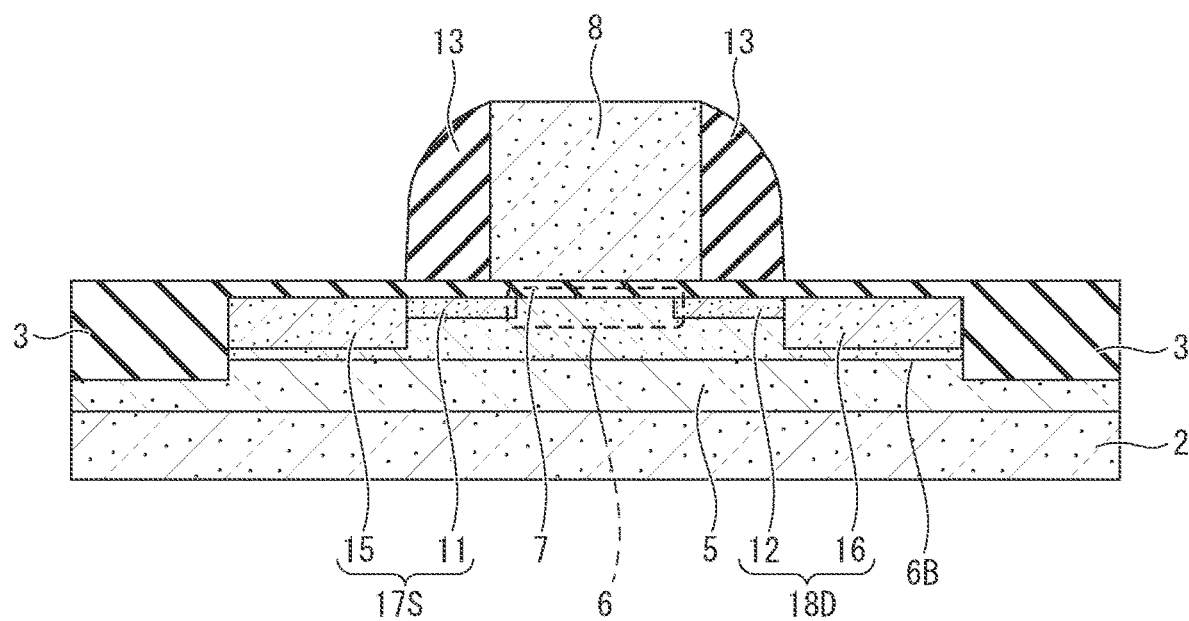
FIG. 15 is still another cross-sectional view of the main part for a description of the manufacturing method of the semiconductor device according to the embodiment of the present disclosure.

Next, activation annealing as fifth heat treatment for activating arsenic ions is performed on the silicon substrate 2 after arsenic ions as the contact impurity ions have been implanted thereinto. The fifth heat treatment causes n-type contact regions 15 and 16 to be formed in the contact impurity ion-implanted regions 15A and 16A, into which arsenic ions are implanted as contact impurities, respectively, as illustrated in FIG. 15. The contact regions 15 and 16 are formed in the surface layer portion of the channel impurity layer 6B in alignment with the sidewall spacers 13. In addition, the contact regions 15 and 16 are formed deeper than the extension regions 11 and 12.

The fifth heat treatment causes the source region 17S including the extension region 11 and the contact region 15 to be formed and, in conjunction therewith, the drain region 18D including the extension region 12 and the contact region 16 to be formed.

Next, the silicide layers 19 are formed on the respective surfaces of the gate electrode 8 and the contact regions 15 and 16. The silicide layers 19 are formed by first removing the through film 14, exposing the respective surfaces of the gate electrode 8 and the contact regions 15 and 16, and subsequently forming a high melting point metal film all over the surface of the silicon substrate 2 including these surfaces by a sputtering method. Succeedingly, metal-semiconductor reaction layers are formed by making respective silicon in the gate electrode 8 and the contact regions 15 and 16 and metal in the high melting point metal film react with each other by heat treatment. Finally, by selectively removing an unreacted high melting point metal film other than the metal-semiconductor reaction layers and subsequently performing heat treatment and thereby stabilizing the structure of the metal-semiconductor reaction layers, the silicide layers 19 illustrated in FIG. 1 are formed.

Consequently, the MOSFET-Qn illustrated in FIG. 1 is substantially completed. The MOSFET-Qn formed in this manner has the channel region 6 between the source region 17S and the drain region 18D. The channel region 6 is a region formed between the source region and the drain region within the channel impurity layer 6B.

Subsequently, although illustration is omitted, an interlayer insulating film is formed all over the surface of the silicon substrate 2 including the upper surface of the MOSFET-Qn, contact holes that expose the respective surfaces of the gate electrode 8, the source region 17S, and the drain region 18D of the MOSFET-Qn are subsequently formed in the interlayer insulating film, and conductive plugs are subsequently buried inside the contact holes. Next, wirings connected to the conductive plugs are formed on the interlayer insulating film, and, by subsequently forming a protective film on the interlayer insulating film in such a way as to cover the wirings, the semiconductor device 1 including the MOSFET-Qn constituting an analog circuit is substantially completed.

3. Characteristics of Semiconductor Device (Distribution of Fluorine in Depth Direction)

Figure 16:
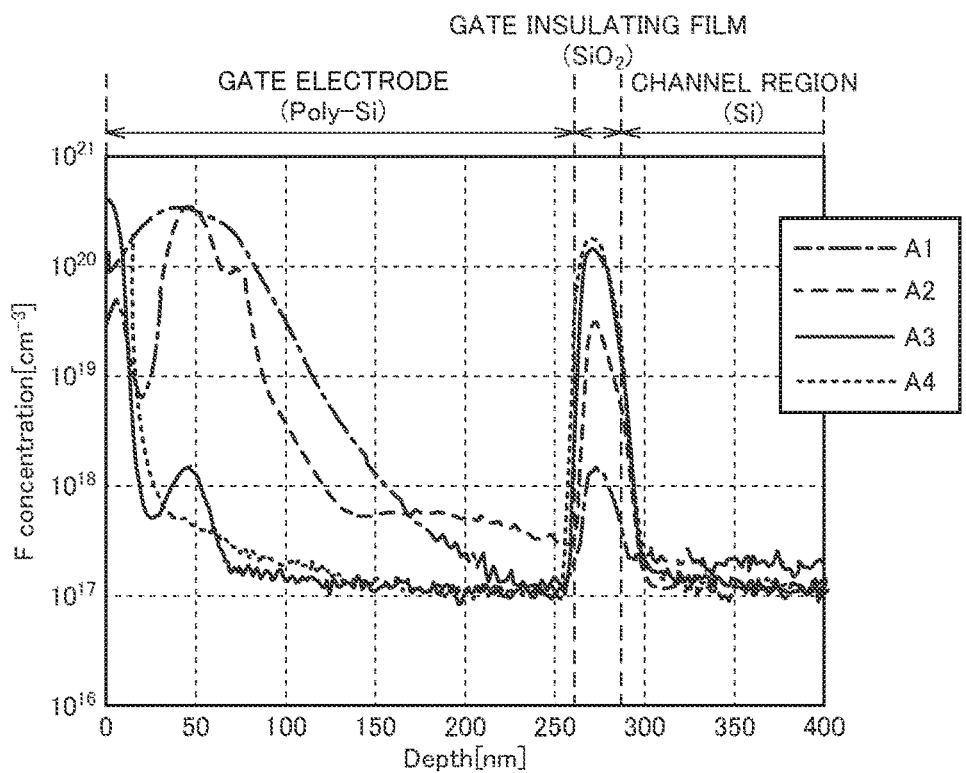
FIG. 16 is a diagram for a description of the semiconductor device and the manufacturing method thereof according to the embodiment of the present disclosure and a graph illustrative of fluorine concentration distributions in the depth direction of a gate insulating film measured by SIMS measurement.
Figure 17:
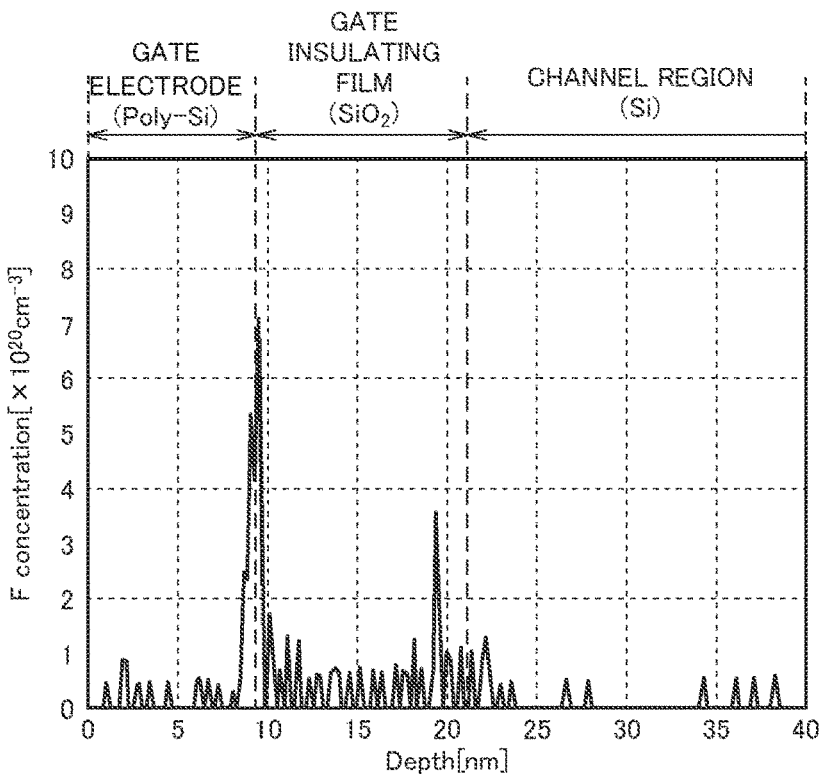
FIG. 17 is another diagram for a description of the semiconductor device and the manufacturing method thereof according to the embodiment of the present disclosure and a graph illustrative of a fluorine concentration distribution in the depth direction of the gate insulating film measured by atom probe measurements.

In FIGS. 16 and 17, distributions of fluorine in the depth direction in the case where the thickness of the gate insulating film is set at 12 nm and the dose amount of fluorine into the polysilicon film 8A is set at $6\times10^{15}$ $cm^{-2}$ are illustrated. FIG. 16 is a graph illustrative of measurement results of fluorine concentration by secondary ion mass spectrometry (SIMS). In FIG. 16, fluorine concentration immediately after fluorine ions have been implanted into the polysilicon film 8A after the second heat treatment (see FIG. 7) (data A1 illustrated by the alternate long and short dash line), fluorine concentration after the film formation of a hard mask (see FIG. 9) (data A2 illustrated by the dashed line), fluorine concentration after fluorine have been diffused into the gate insulating film 7 by the reoxidation process (see FIG. 10) (data A3 illustrated by the solid line), and fluorine concentration after the formation of the source region 17S and the drain region 18D (see FIG. 15) (data A4 illustrated by the dotted line) are illustrated. FIG. 17 is a graph illustrative of a measurement result of fluorine concentration in the n-channel conductivity type MOSFET-Qn by atom probe measurements.

FIG. 16 reveals that fluorine implanted into the polysilicon film 8A diffused into the gate insulating film 7 by the reoxidation process. This result reveals that it is not necessary to add a dedicated step for diffusing fluorine into the gate insulating film 7 and it is possible to achieve reduction in 1/f noise of a MOS transistor at low cost.

In order to confirm how fluorine segregates in more detail, measurement of fluorine concentration using an atom probe was performed. As illustrated in FIG. 17, it is revealed that fluorine concentration at the interface of the gate insulating film 7 with the gate electrode 8 (in the first interface region) is higher than fluorine concentration at the interface of the gate insulating film 7 with the channel region 6 (in the second interface region). In addition, it can be confirmed that the concentrations of fluorine in the first interface region and the second interface region are higher than the concentration of fluorine existing in the middle region in the depth direction of the gate insulating film 7 and fluorine segregates in both interface regions of the gate insulating film 7. The concentration of fluorine in the first interface region is $7 \times 10^{20}$ cm$^{-3}$, and the concentration of fluorine in the second interface region is $3.5 \times 10^{20}$ cm$^{-3}$.

(Distribution of Fluorine in Gate Length Direction)

Figure 18:
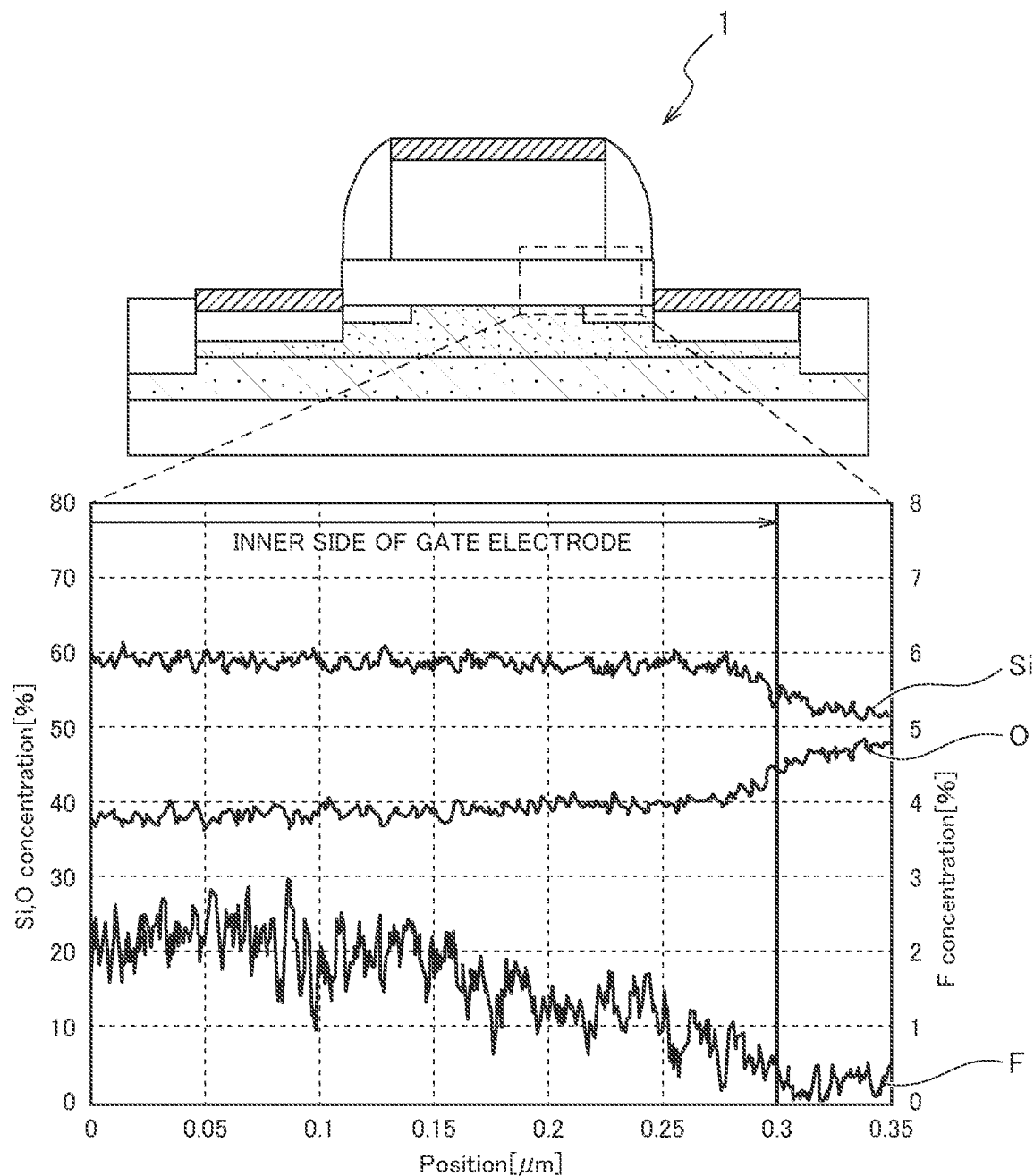
FIG. 18 is still another diagram for a description of the semiconductor device and the manufacturing method thereof according to the embodiment of the present disclosure and a graph illustrative of a fluorine concentration distribution in the gate length direction in the gate insulating film measured by energy dispersive x-ray spectroscopy.

In FIG. 18, a distribution of fluorine in the gate length direction in the gate insulating film of the re-channel conductivity type MOSFET-Qn is illustrated. FIG. 18 is a graph illustrative of a measurement result of fluorine concentration by energy dispersive x-ray spectroscopy (EDX).

As illustrated in FIG. 18, the concentration of fluorine in the gate insulating film is lower at the position of an edge of the gate electrode than at positions in the other region. In the reoxidation process, when fluorine is diffused into the gate insulating film, outward diffusion of fluorine from the vicinity of an edge of the gate electrode occurs at the same time as diffusion of fluorine in the depth direction. It is revealed that, for this reason, the fluorine concentration starts to decrease at a position 150 nm inward in the gate length direction from an edge of the gate electrode and the fluorine concentration at the position of the gate edge of the gate insulating film is one third or less of the fluorine concentration at the middle position in the gate length direction of the gate electrode.

(Dependence of Interface State Density on Fluorine Dose Amount)

Figure 19:
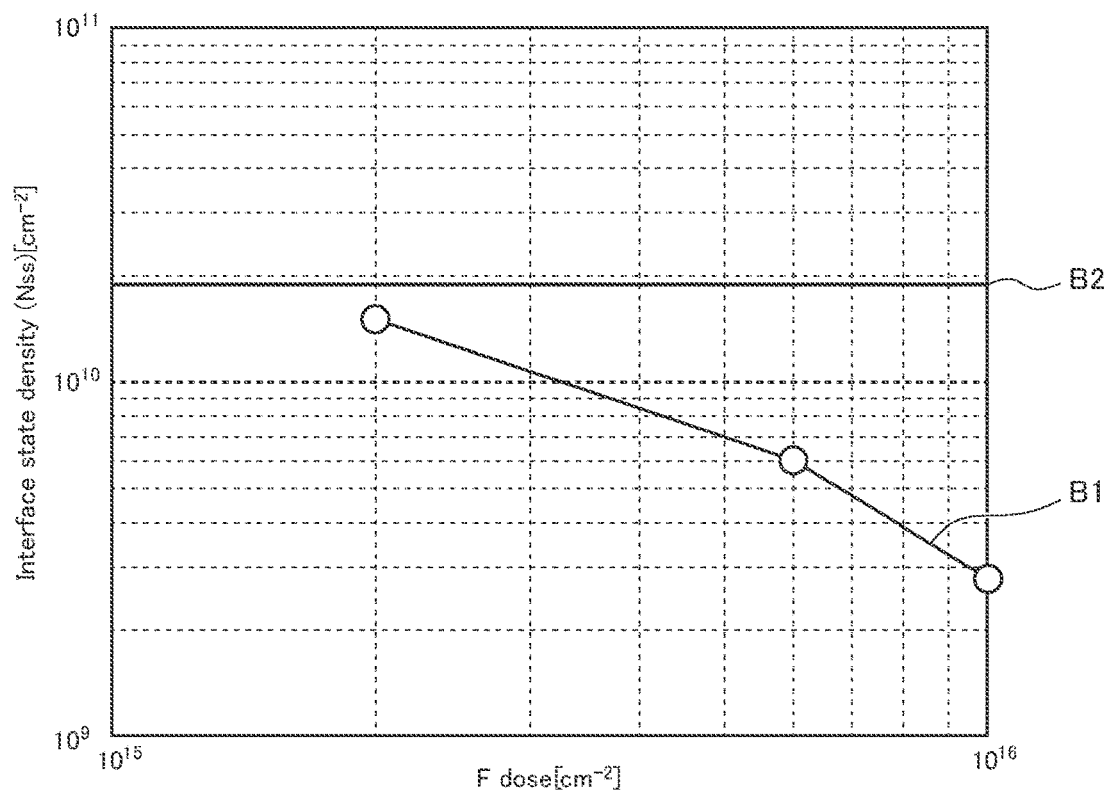
FIG. 19 is still another diagram for a description of the semiconductor device and the manufacturing method thereof according to the embodiment of the present disclosure and a graph illustrative of dependence of interface state density on a fluorine dose amount in a second interface region of the gate insulating film.

In FIG. 19, dependence of interface state density in the second interface region of the gate insulating film in the MOSFET-Qn on the fluorine dose amount in the case where the thickness of the gate insulating film is set at 12 nm (data B1) is illustrated. Note that, in FIG. 19, interface state density in the second interface region of the gate insulating film in the case where the implantation of fluorine ions is not performed (data B2) is illustrated as a comparative example.

As illustrated in FIG. 19, increasing the fluorine dose amount into the polysilicon film enables the interface state density in the second interface region to be reduced. Increasing the fluorine dose amount to $4 \times 10^{15}$ cm$^{-2}$ or more enables the interface state density to be reduced to $1 \times 10^{10}$ cm$^{-2}$ or less. However, excessively increasing the fluorine dose amount causes the lifetime of the gate insulating film to be adversely affected. Since the fluorine concentration in the gate insulating film exceeding $1 \times 10^{21}$ cm$^{-3}$ causes the lifetime of the gate insulating film to deteriorate, it is preferable to set the fluorine dose amount at $8 \times 10^{15}$ cm$^{-2}$ or less.

(Influence of Fluorine Ion Implantation Timing on Lifetime of Gate Insulating Film)

Figure 20:
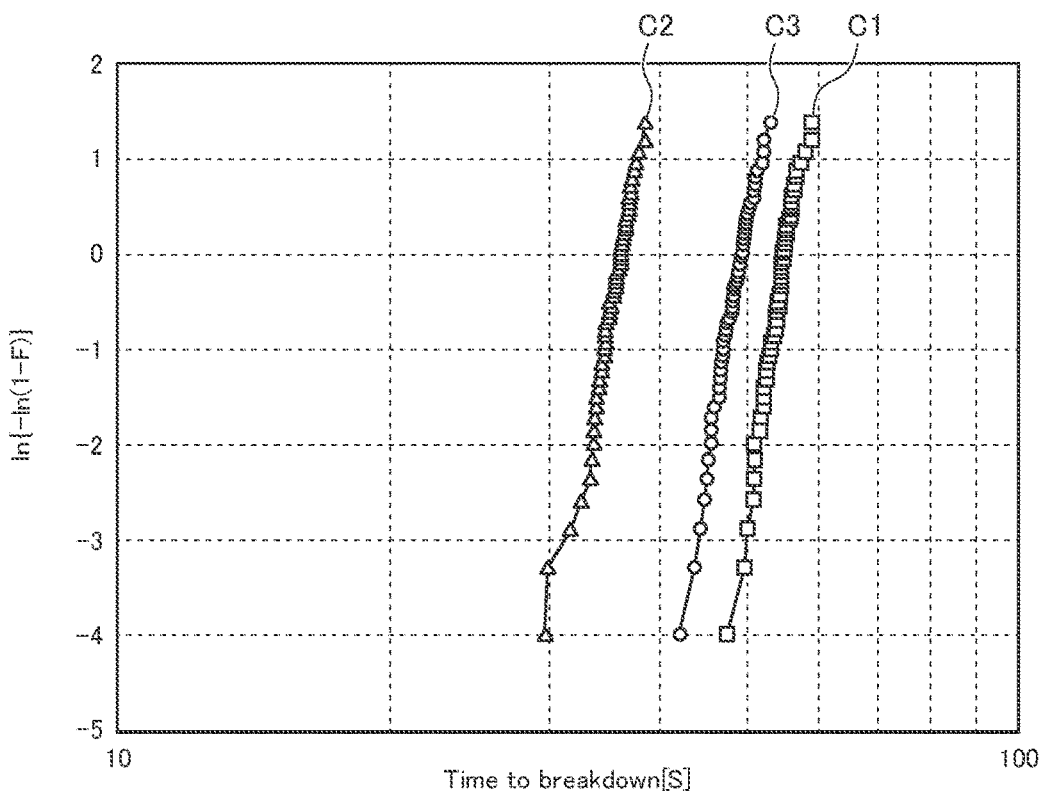
FIG. 20 is still another diagram for a description of the semiconductor device and the manufacturing method thereof according to the embodiment of the present disclosure and a graph illustrative of influence of fluorine ion implantation timing on a lifetime of the gate insulating film.

In FIG. 20, influence of fluorine ion implantation timing on the lifetime of the gate insulating film is illustrated. In FIG. 20, as a scale to indicate the lifetime of the gate insulating film, a cumulative failure rate F due to insulation breakdowns is plotted in the form of $\ln\{-\ln(1-F)\}$. Note that FIG. 20 illustrates results in the case where the thickness of the gate insulating film is set at 12 nm, the fluorine dose amount into the polysilicon film is set at $6 \times 10^{15}$ cm$^{-2}$, measurement temperature is set at 125° C., stressing gate current density (Jg) is set at 0.1 A/cm$^2$, and element area is set at 4000 (40×100) μm$^2$.

In FIG. 20, a cumulative failure rate due to insulation breakdowns in the case where fluorine ions are implanted into the polysilicon film after the second heat treatment (high-temperature lamp annealing) (data C1), a cumulative failure rate due to insulation breakdowns in the case where the second heat treatment (high-temperature lamp annealing) is performed after fluorine ions are implanted into the polysilicon film (data C2), and a cumulative failure rate due to insulation breakdowns in the case where fluorine ions are not implanted into the polysilicon film (data C3) are illustrated.

As illustrated in FIG. 20, in the case where fluorine ions are implanted into the polysilicon film after the high-temperature lamp annealing (data C1), the lifetime of the gate insulating film is improved compared with the case where fluorine ions are not implanted (data C3). On the other hand, in the case where the high-temperature lamp annealing is performed after fluorine ions have been implanted into the polysilicon film (data C2), the lifetime of the gate insulating film deteriorates compared with the case where fluorine ions are not implanted (data C3). This result reveals that the fluorine ion implantation is preferably performed after the high-temperature lamp annealing.

(Segregation of Fluorine Depending on Fluorine Ion Implantation Timing)

Figure 21:
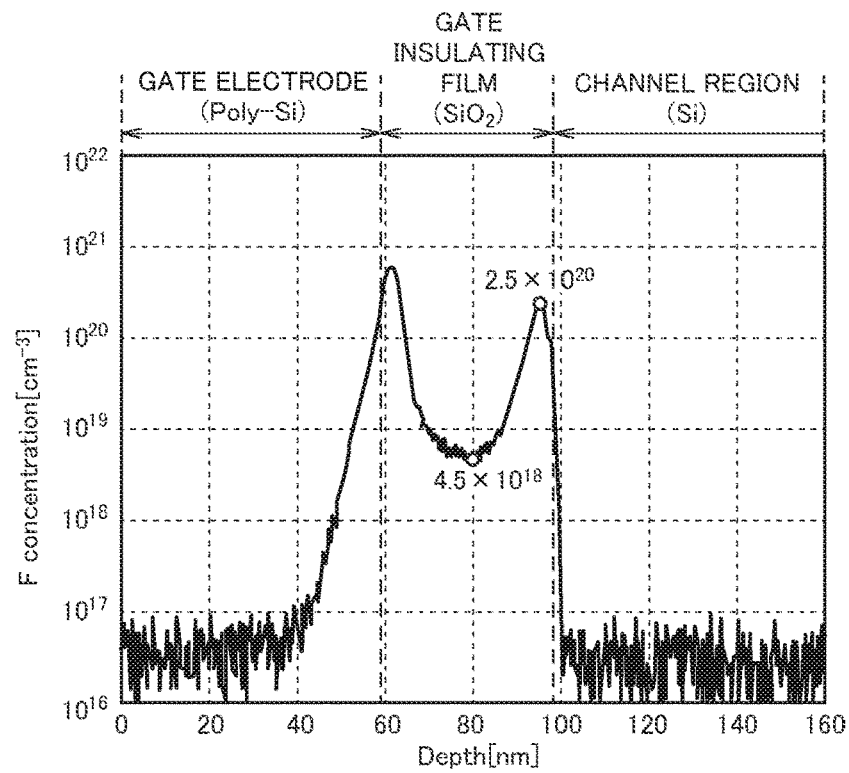
FIG. 21 is still another diagram for a description of the semiconductor device and the manufacturing method thereof according to the embodiment of the present disclosure and a graph illustrative of a result of measurement of a distribution of fluorine in the depth direction in the case where fluorine ions are implanted after high-temperature lamp annealing measured by the SIMS measurement.
Figure 22:
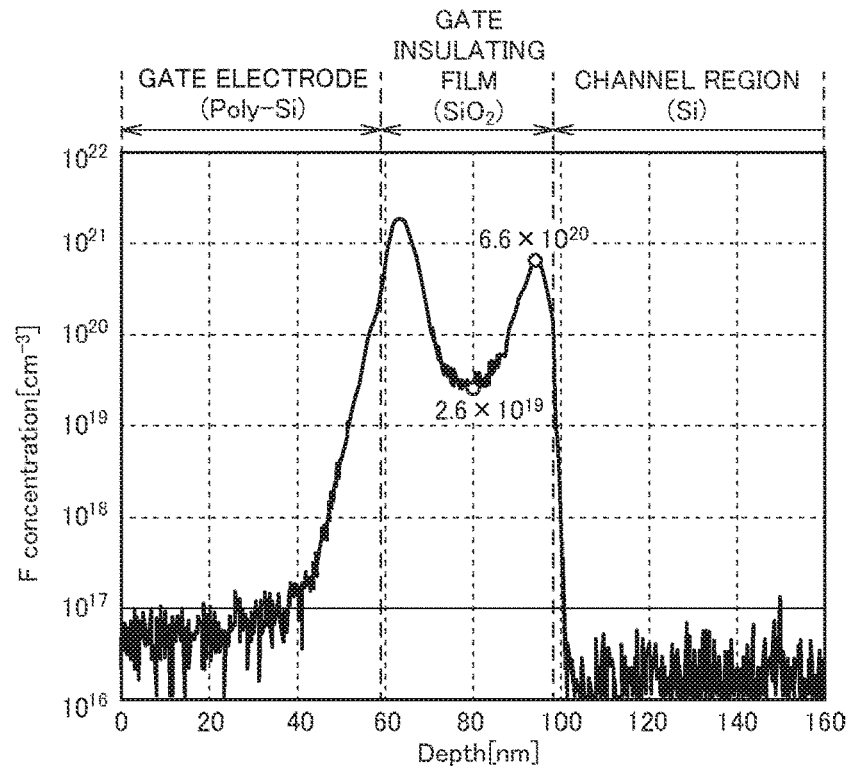
FIG. 22 is still another diagram for a description of the semiconductor device and the manufacturing method thereof according to the embodiment of the present disclosure and a graph illustrative of a result of measurement of a distribution of fluorine in the depth direction in the case where high-temperature lamp annealing is performed after fluorine ions have been implanted measured by the SIMS measurement.

In FIGS. 21 and 22, results of measurements of distributions of fluorine in the depth direction for different fluorine ion implantation timings, which were performed by the SIMS measurement, are illustrated. The measurement was performed to investigate the reason why a time dependent dielectric breakdown (TDDB) lifetime changes depending on the fluorine ion implantation timing. In FIG. 21, a distribution of fluorine in the depth direction in the case (example) where fluorine ions are implanted into the polysilicon film after the second heat treatment (high-temperature lamp annealing) is illustrated. In FIG. 22, a distribution of fluorine in the depth direction in the case (comparative example) where the second heat treatment (high-temperature lamp annealing) is performed after fluorine ions have been implanted into the polysilicon film is illustrated. In the SIMS measurement, the thickness of the gate insulating film is set at 40 nm in order to facilitate the fluorine distribution to be observed. In both FIGS. 21 and 22, the fluorine dose amount is set at $1 \times 10^{16}$ cm$^{-2}$.

As illustrated in FIG. 21, in the case of the example in which fluorine ions are implanted into the polysilicon film after the high-temperature lamp annealing, a peak value of the fluorine concentration in the first interface region is approximately $6 \times 10^{20}$ cm$^{-3}$ and a peak value of the fluorine concentration in the second interface region is approximately $2.5 \times 10^{20}$ cm$^{-3}$. In addition, a minimum value of the fluorine concentration in the gate insulating film is approximately $4.5 \times 10^{18}$ cm$^{-3}$.

On the other hand, as illustrated in FIG. 22, in the comparative example in which the high-temperature lamp annealing is performed after fluorine ions have been implanted into the polysilicon film, a peak value of the fluorine concentration in the first interface region is approximately $2 \times 10^{21}$ cm$^{-3}$, a peak value of the fluorine concentration in the second interface region is approximately $6.6 \times 10^{20}$ cm$^{-3}$, and a minimum value of the fluorine concentration in the gate insulating film is approximately $2.6 \times 10^{19}$ cm$^{-3}$.

As illustrated in FIG. 21, in the example in which fluorine ions are implanted into the polysilicon film after the high-temperature lamp annealing, the fluorine segregation ratio was 55. On the other hand, in the comparative example in which the high-temperature lamp annealing is performed after fluorine ions have been implanted into the polysilicon film, the fluorine segregation ratio was 25.

The purpose of the introduction of fluorine is to terminate interface states in the second interface region, using fluorine. As such, it is preferable that the fluorine segregation ratio be high. It is considered that, in the case of the comparative example, the high-temperature lamp annealing facilitated the entire gate insulating film to react with fluorine, which caused the film quality of the gate insulating film to deteriorate.

(1/f Noise Characteristics Depending on Fluorine Ion Implantation)

Figure 23:
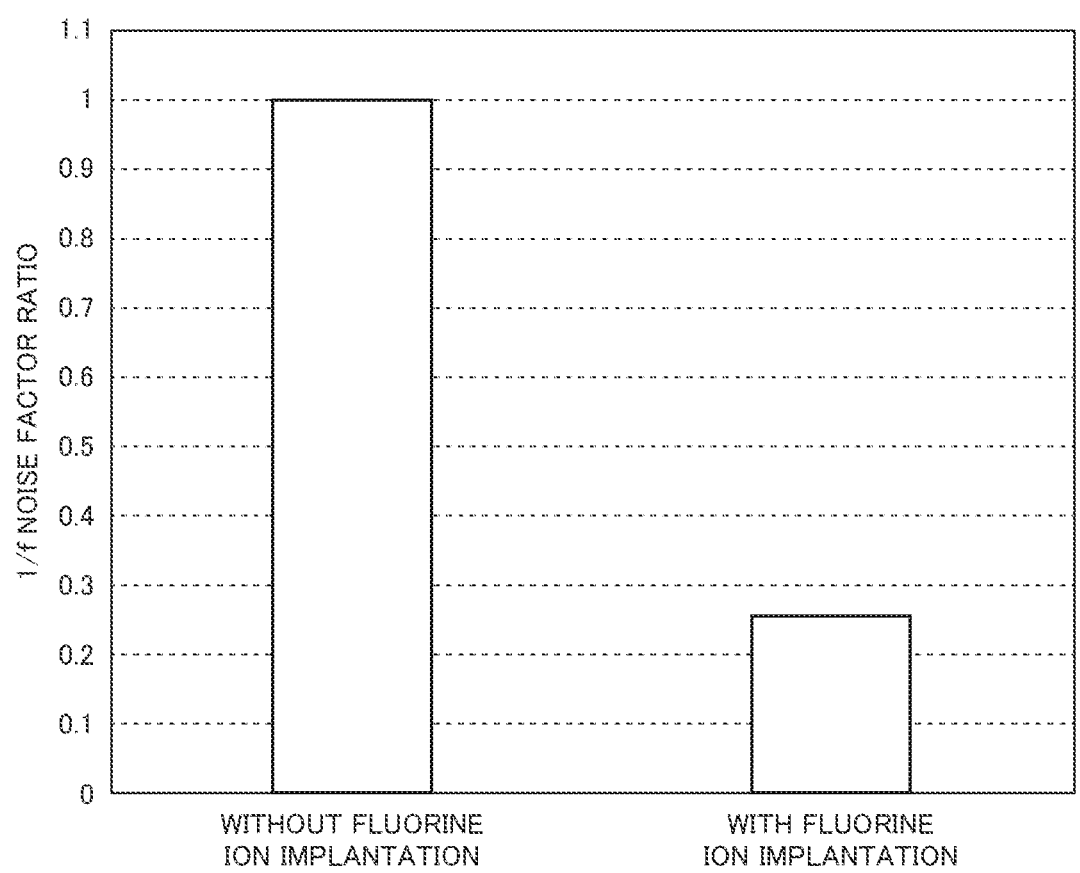
FIG. 23 is still another diagram for a description of the semiconductor device and the manufacturing method thereof according to the embodiment of the present disclosure and a graph illustrative of a 1/f noise factor ratio in the case where implantation of fluorine ions is performed and a 1/f noise factor ratio in the case where implantation of fluorine ions is not performed.

In FIG. 23, a 1/f noise factor ratio in the case where the implantation of fluorine ions is performed and a 1/f noise factor ratio in the case where the implantation of fluorine ions is not performed are illustrated. The measurement of the 1/f noise factor ratios was performed on a MOSFET-Qn that is configured in such a way that influence of decrease in the fluorine concentration in the gate insulating film in the vicinities of edges of the gate electrode is reduced by setting the gate width Wg at 10 μm, the gate length Lg at 2 μm, the thickness of the gate insulating film at 12 nm, and the fluorine dose amount into the polysilicon film at $6\times10^{15}$ $cm^{-2}$ and locating the junction positions of the extension regions 90 nm inward from the edges of the gate electrode. In addition, the measurement of the 1/f noise factor ratios was performed under the bias condition that both the gate voltage Vg and the drain voltage Vd are the threshold voltage Vth plus 0.4 V.

A 1/f noise factor (Kf) is calculated using the formula (1) below.

$$Kf = Svg \times Cox \times Wg \times Lg \times f \quad (1)$$

In the formula (1), gate voltage equivalent noise, gate oxide film capacitance, gate width, physical gate length, and gate length frequency are denoted by Svg, Cox, Wg, Lg, and f, respectively.

As illustrated in FIG. 23, in the case where fluorine ions are implanted into the polysilicon film after the high-temperature lamp annealing, 1/f noise can be reduced by approximately 75% compared with the case where fluorine ions are not implanted.

Note that, in the above-described embodiment, the semiconductor device 1 including the MOSFET-Qn the gate insulating film of which is a silicon dioxide film was described as an insulated gate type field effect transistor. However, the present disclosure is not limited to the embodiment, and the present disclosure is applicable to a semiconductor device including a metal insulator semiconductor field effect transistor (MISFET) the gate insulating film of which is made of a silicon nitride film, a high permittivity insulating film, or the like as an insulated gate type field effect transistor.

The scope of the present invention is not limited to the illustrated and described exemplary embodiments, but includes all embodiments that provide the same effects as those intended by the present invention. Further, the scope of the present invention is not limited to the combinations of features of the invention defined by the claims, but can be defined by any desired combination of particular features among all the disclosed features.

REFERENCE SIGNS LIST

1 Semiconductor device
2 Silicon substrate
3 Element separation layer
4 Through film
5 Well region
5A Well impurity ion-implanted region
6 Channel region
6A Channel impurity ion-implanted region
6B Channel impurity layer
7 Gate insulating film
8 Gate electrode
9 Hard mask
10 Oxide film
11, 12 Extension region
11A, 12A Extension impurity ion-implanted region
13 Sidewall spacer
15, 16 Contact region
15A, 16A Contact impurity ion-implanted region
17S Source region
18D Drain region
19 Silicide layer

The invention claimed is:

1. A semiconductor device comprising:
a well region disposed in a surface layer portion of a semiconductor substrate;
a source region and a drain region arranged separated from each other in a surface layer portion of the well region;
a channel region disposed between the source region and the drain region; and
a gate electrode disposed on the channel region via a gate insulating film containing fluorine,
wherein a fluorine concentration existing in a first interface region, the first interface region being an interface of the gate insulating film with the gate electrode, and a fluorine concentration existing in a second interface region, the second interface region being an interface of the gate insulating film with the channel region, are higher than a fluorine concentration existing in a middle region in a depth direction of the gate insulating film and the fluorine concentration in the first interface region is higher than the fluorine concentration in the second interface region, and
wherein a peak value of the fluorine concentration in the second interface region is 30 times or more of a minimum value of a fluorine concentration in the date insulating film.

2. The semiconductor device according to claim 1, wherein a peak value of the fluorine concentration in the second interface region is $1\times10^{20}$ $cm^{-3}$ or more and $1\times10^{21}$ $cm^{-3}$ or less.

3. The semiconductor device according to claim 1, wherein a thickness of the gate insulating film is 2 nm or more.

4. The semiconductor device according to claim 1, wherein an interface state density in the second interface region is $1\times10^{10}$ $cm^{-2}$ or less.

5. The semiconductor device according to claim 1, wherein the gate electrode is formed of polysilicon.

6. The semiconductor device according to claim 1, wherein a gate length of the gate electrode is 300 nm or more.

7. The semiconductor device according to claim 1 comprising an extension region formed in each of the source region and the drain region, the extension region being adjacent to the channel region,
wherein a junction position between each of the extension regions and the channel region is located 30 nm or more inward from an edge of the gate electrode.

8. A semiconductor device comprising:
a well region disposed in a surface layer portion of a semiconductor substrate;
a source region and a drain region arranged separated from each other in a surface layer portion of the well region;
a channel region disposed between the source region and the drain region; and
a gate electrode disposed on the channel region via a gate insulating film containing fluorine, wherein a fluorine concentration existing in a first interface region, the first interface region being an interface of the gate insulating film with the gate electrode, and a fluorine concentration existing in a second interface region, the second interface region being an interface of the gate insulating film with the channel region, are higher than a fluorine concentration existing in a middle region in a depth direction of the gate insulating film and the fluorine concentration in the first interface region is higher than the fluorine concentration in the second interface region, and wherein a concentration of fluorine in the gate insulating film decreases from a position 150 nm inward in a gate length direction from an edge of the gate electrode toward the edge of the gate electrode.

9. A semiconductor device comprising:
a well region disposed in a surface layer portion of a semiconductor substrate;
a source region and a drain region arranged separated from each other in a surface layer portion of the well region;
a channel region disposed between the source region and the drain region; and
a gate electrode disposed on the channel region via a gate insulating film containing fluorine,
wherein a fluorine concentration existing in a first interface region, the first interface region being an interface of the gate insulating film with the gate electrode, and a fluorine concentration existing in a second interface region, the second interface region being an interface of the gate insulating film with the channel region, are higher than a fluorine concentration existing in a middle region in a depth direction of the gate insulating film and the fluorine concentration in the first interface region is higher than the fluorine concentration in the second interface region, and
wherein a concentration of fluorine in the gate insulating film at a position of an edge of the gate electrode is one third or less of a concentration of fluorine in the gate insulating film at a middle position in a gate length direction of the gate electrode.

* * * * *